(12) United States Patent
Yang et al.

(10) Patent No.: US 6,933,081 B2
(45) Date of Patent: Aug. 23, 2005

(54) METHOD FOR QUARTZ BUMP DEFECT REPAIR WITH LESS SUBSTRATE DAMAGE

(75) Inventors: Baorui Yang, Pflugerville, TX (US); Matthew Lamantia, Cedar Park, TX (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 10/144,712

(22) Filed: May 15, 2002

(65) Prior Publication Data

US 2003/0215721 A1 Nov. 20, 2003

(51) Int. Cl.[7] .................................................. G03F 9/00
(52) U.S. Cl. ................ 430/5; 204/192.34; 204/192.33; 204/298.32; 204/298.36
(58) Field of Search .......................... 430/5; 204/192.34, 204/192.33, 298.32, 298.36

(56) References Cited

U.S. PATENT DOCUMENTS

| 5,882,823 | A | | 3/1999 | Neary |
| 6,030,731 | A | | 2/2000 | Yang |
| 6,096,459 | A | * | 8/2000 | Yang ............................ 430/5 |
| 6,114,073 | A | | 9/2000 | Yang |
| 6,277,526 | B1 | | 8/2001 | Yang |
| 6,346,352 | B1 | * | 2/2002 | Hayden et al. ................ 430/5 |

* cited by examiner

*Primary Examiner*—Geraldine Letscher
(74) *Attorney, Agent, or Firm*—Dickstein Shapiro Morin & Oshinsky LLP

(57) ABSTRACT

A method for minimizing damage to a substrate while repairing a defect in a phase shifting mask for an integrated circuit comprising locating a bump defect in a phase shifting mask, depositing a first layer of protective coating to an upper surface of the bump defect, depositing a second layer of protective coating to areas of the phase shifting mask adjacent the bump defect, etching the first layer of protective coating and removing the bump defect.

54 Claims, 10 Drawing Sheets

METHOD FOR QUARTZ BUMP DEFECT REPAIR WITH LESS SUBSTRATE DAMAGE

FIELD OF THE INVENTION

This invention generally relates to a method and apparatus for using a focused ion beam (FIB) tool for repairing masks. Particularly, the invention relates to a method for removing quartz defects from phase shifting masks while minimizing damage to surrounding areas.

BACKGROUND OF THE INVENTION

In the manufacture of semiconductor wafers, microlithography is used to pattern various layers on a wafer. A layer of resist is deposited on the wafer and exposed using an exposure tool and a template such as a mask or reticle. Reticles and masks typically consist of an opaque thin film of a metal, such as chromium, deposited in a pattern on a transparent substrate of quartz or glass. During the exposure process a form of radiant energy, such as ultraviolet light, is directed through the template to selectively expose the resist in a desired pattern. The resist is then developed to remove either the exposed portions for a positive resist or the unexposed portions for a negative resist, thereby forming a resist pattern on the wafer. The resist pattern can then be used to protect underlying areas of the wafer during subsequent fabrication processes, such as deposition, etching, or ion implantation processes.

Manufacturers in the field of integrated circuits (ICs) have been trying to reduce the geometric size of the devices on integrated circuits. The benefits achieved by reducing device dimensions include higher performance of circuit elements and smaller packaging sizes. Improving lithographic techniques provide improved resolution and results in a potential reduction of device dimensions. However, at small geometries, diffraction effects such as proximity effects, poor subject contrast, and poor resolution result, producing wafers with incomplete or erroneous circuit patterns.

A lithographic technique useful at small geometries is known as phase shifting lithography. In phase shifting lithography, the interference between waves of exposure energy is used to overcome diffraction effects and to improve the resolution and depth of optical images projected onto a target. Phase shifting lithography involves controlling the phase of exposure light at the target such that adjacent bright areas are formed preferably 180 degrees out of phase with one another. Dark regions are thus produced between the bright areas by destructive interference even when diffraction would otherwise cause these areas to be lit. This technique improves total resolution at the target (i.e., wafer) and allows resolutions as fine as 0.10 microns to occur.

Phase shifting areas in a mask are typically formed by varying the thickness of one transparent portion of the mask with respect to another transparent portion. Thickness of transparent portions is usually reduced by etching. The etch is carefully controlled to create trenches having a specified depth so light passing through the region with a trench passes through a quartz substrate thinned compared to light passing through a neighboring region that has the full thickness of quartz, the difference in thickness providing a 180° phase difference in the light transmitted by each. Because of the interference of the out of phase light there is a significant intensification of contrast between adjacent regions when light is shined through the mask, and this intensification of contrast provides the ability to resolve significantly smaller structures than can be achieved without phase shifting. Typically, the etch depth is controlled to provide a relative shift between the two neighboring regions of half of the wavelength of the light used with the mask to expose semiconductor wafers, thereby providing the 180° phase difference. Masks having other phase differences, e.g., 90° or 270°, have also been produced.

Etching and associated processes often leave behind defects in masks. Opaque defects, which may occur as spots, pattern extensions, bridges between adjacent patterns, or the like, are the result of opaque material such as chromium or molybdenum silicide being present in a non-pattern area. Clear defects, which generally occur as bumps, pinholes, missing parts, or breaks in the pattern, can result from missing or inadequate layers of opaque material in a pattern area on the template.

Focused ion beams (FIBs) have been used for repair of optical masks and reticles since the mid-1980s. The ability of the FIB to accurately remove unwanted portions of the metal film and to deposit material to "edit" the pattern makes it potentially an almost ideal repair tool. A FIB exposes a template to a beam of positively charged ions, typically gallium ions, via an optical system. When a template is exposed to the ion beam, secondary ions and electrons are produced, and may be detected by the FIB machine and monitored to determine the progress of repair work. If a chromium pattern is exposed, secondary chromium ions are generated, and if a silicon or glass pattern is exposed, secondary silicon ions are generated.

Analogous to opaque defects are regions where quartz should have been etched but was not. In these regions of the mask there remain unwanted areas of full or partial thickness quartz. Defects are likely in the quartz due to a mechanism such as foreign material falling on the mask before or during the quartz etch step that follows chrome repair. When FIB machines are used to repair such defects, undesirable byproducts are often generated. The high energy focused ion beam used to remove the quartz bump defect can cause damage to areas of the phase shifting mask surrounding the defect. This is usually due to scattering of the ion beam after it imparts the quartz bump defect, or due to inaccurate alignment of the ion beam.

Thus, a solution is needed that provides for accurately and reliably repairing defects in the quartz of phase shift masks, while minimizing damage to the substrate.

BRIEF SUMMARY OF THE INVENTION

The present invention relates to a method for repairing a defect in a phase shifting mask for an integrated circuit comprising locating at least one bump defect in a phase shifting mask, depositing a first layer of protective coating to an upper surface of the bump defect, depositing a second layer of protective coating to areas of the phase shifting mask adjacent the bump defect, etching the first layer of protective coating and then removing the bump defect.

Additionally, this invention relates to an apparatus for repairing a defect in a photolithographic mask comprising a device for shining a focused ion beam onto a mask, and a mechanism for repairing a bump defect on the mask such that the mechanism locates a bump defect, deposits a first layer of protective material onto a top surface of the bump defect and a second layer of protective material onto areas of the mask adjacent the bump defect. The apparatus then removes the first layer of protective material from the top surface of the bump defect, and removes the bump defect using a focused ion beam.

These and other aspects and advantages of the invention will be apparent from the following detailed description and accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and procedural changes may be made without departing from the spirit or scope of the present invention.

Figure 1:
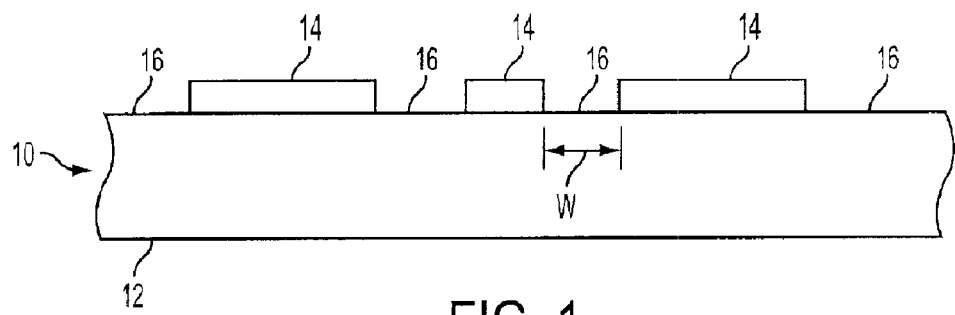
FIG. 1 is a side-sectional view of a mask.

With reference to FIG. 1, a traditional mask 10 has a transparent substrate 12 made from a material such as quartz. Opaque material 14 is deposited on the substrate 12 to form a pattern of clear areas 16 in between the opaque material 14. Exemplary materials for the opaque material 14 are chromium, or metal compounds such as molybdenum silicide, chromium fluoride and chromium oxide. The technique for fabricating the opaque material shapes is well known in the art and is not discussed in detail herein. For example, a blanket layer of chromium may be deposited on a quartz substrate, and then photolithographically patterned. For a phase shift mask the quartz substrate is etched in locations defined by the spaces between the chromium patterns.

The clear areas 16 have a width W. As integrated circuits decrease in size, the line widths W continue to shrink. One known problem with conventional masks 10 is that diffraction causes the light pattern transmitted through the mask to "blur." This problem is particularly acute as the line width W reaches submicron levels. This problem has led to the use of phase shifting masks 20, an example of which is illustrated in FIG. 2.

Phase shifting masks shift (usually by 180 degrees, though other phase shift may also be used) the phase of light transmitted through predetermined clear areas 16. The phase shift is accomplished by providing phase shift areas, or wells, in predetermined clear areas 16. The wells may be provided in different ways. For example, FIG. 2 illustrates a phase shifting mask 20 including a substrate 12 into which phase shifting wells 22 have been etched. Thus, the light transmitted through clear area 16 on one side of an opaque area 14a is phase-shifted with respect to the light transmitted through phase shifting well 22 on the other side of the opaque area 14a. The phase differential height H of the clear areas 16 with respect to the phase shifting wells 22 provides for the alternating phase which is produced as light, or other form of radiation, which is exposed onto the mask 20 and passes through the transparent areas 16 and 22.

Figure 2:
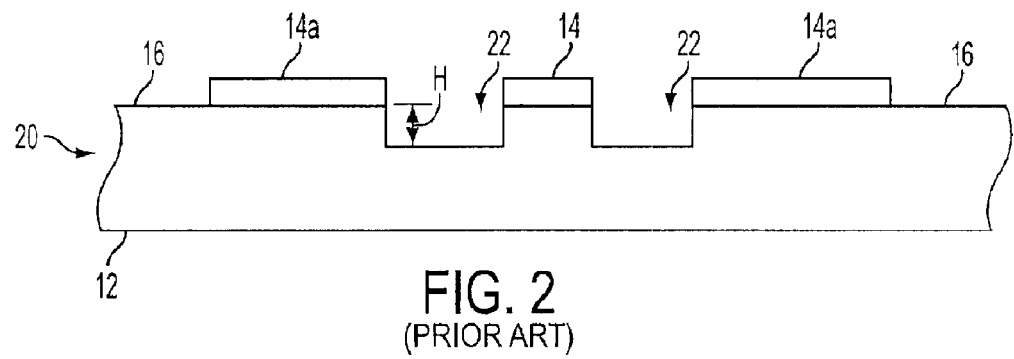
FIG. 2 is a side-sectional view of a phase shifting mask.
Figure 3:
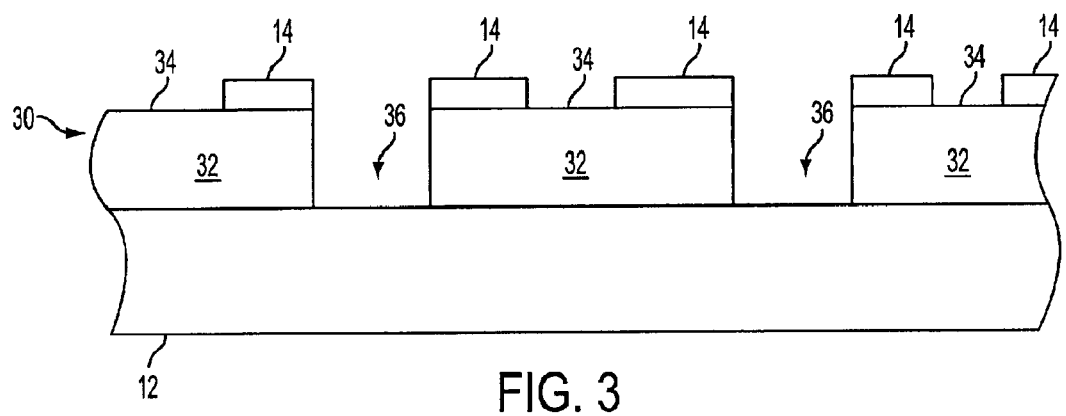
FIG. 3 is a side-sectional view of another phase shifting mask.

FIG. 3 illustrates another type of phase shifting mask 30. Rather than etching phase shifting wells 22 into the substrate 12, a transparent material 32 is provided on top of the substrate 12 in all areas except predetermined phase shifting areas 36. Thus, in phase shifting mask 30, opaque areas 14 and clear areas 34 are on the transparent material 32, while the remaining clear areas are phase shifting wells 36 in which no transparent material 32 is present. The discussion herein will focus on the type of phase shifting mask 20 illustrated in FIG. 2, although those of skill in the art will readily recognize that the discussion and invention are equally applicable to the type of phase shifting mask 30 illustrated in FIG. 3, and other types of phase shifting masks which may require repair of a transparent surface.

Figure 4:
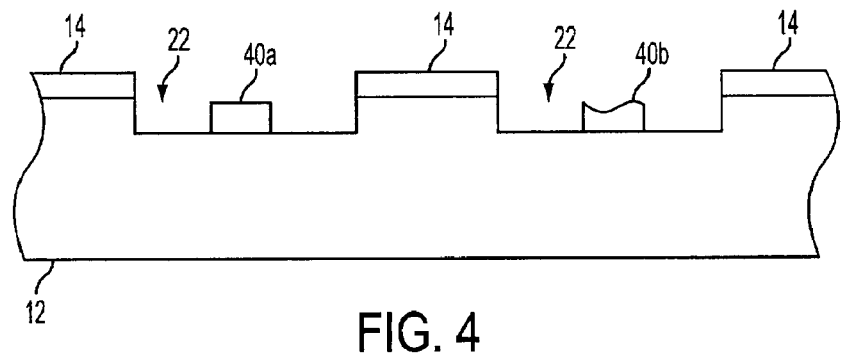
FIG. 4 is a side-sectional view of a phase shifting mask with a defect.

Referring to FIG. 2, when forming the phase shifting mask 20, etching is performed to create phase shift wells 22 in any conventional manner, including anisotropic plasma etching or another process well known in the art. During such a process, defects are often formed in the substrate 12. Defects can be created due to inaccuracies in the etching process, imprecise masking with resist prior to the etching process, inaccurate exposure or residual resist, or due to other shortcomings in manufacturing processes. Examples of such defects 40a and 40b are illustrated in FIG. 4. Defect 40a is in the form of bump having a substantially flat upper surface and defect 40b is in the form a bump having an irregular upper surface. The process of the present invention can be used to correct both types of defects 40a and 40b.

The presence of defects 40a and 40b in the phase shifting mask 20 severely affects the accuracy of the mask when it is later used to pattern layers of material on an integrated circuit. Thus, whenever defects 40a and 40b are found it is important that they are removed or otherwise corrected. It is necessary to remove and planarize the surfaces of defects 40a, 40b to ensure an accurate mask.

Figure 5:
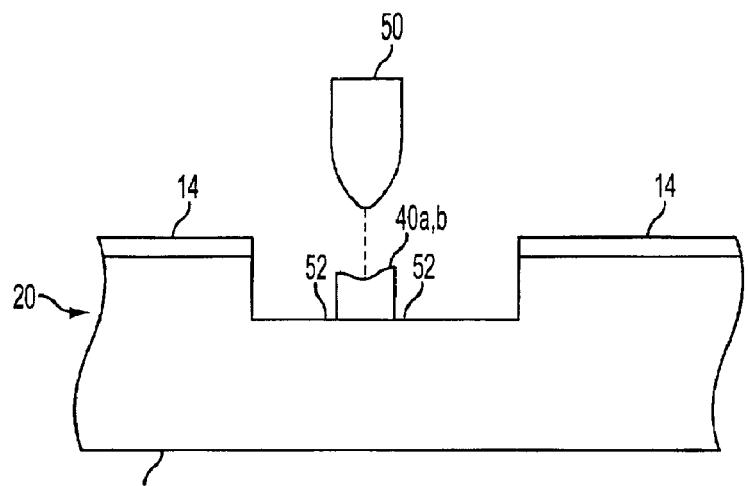
FIG. 5 is side-sectional view of a prior art process for removing the defect from the mask of FIG. 4.

One way to repair defects 40a, 40b is to shine a focused ion beam (FIB) onto the defects, as illustrated in FIG. 5. A FIB device 50 generates actinic radiation to selectively remove the defects 40a, 40b. To be sufficient to remove the defect, the energy from the FIB device 50 must be large enough so that the beam can disrupt the crystal lattice of the light transmissive substrate. One example of a FIB device 50 which could be used to carry out the removal of the defect 40a, 40b is a SIR-3000X manufactured by Seiko Instruments, or any other suitable FIB mask repair tool.

As a result of using the FIB device 50 to remove defects 40a and 40b, one defect is often traded for another. That is, the use of the ion beam in removal of defects 40a and 40b can remove not only the unwanted portion of the transparent substrate, but may also cause damage to adjacent portions of the substrate 52 and thereby create secondary defects in the phase shifting mask 20. In a worst case scenario, defects can bridge adjacent features of a mask causing the semiconductor formed by the mask to short out.

Figure 6:
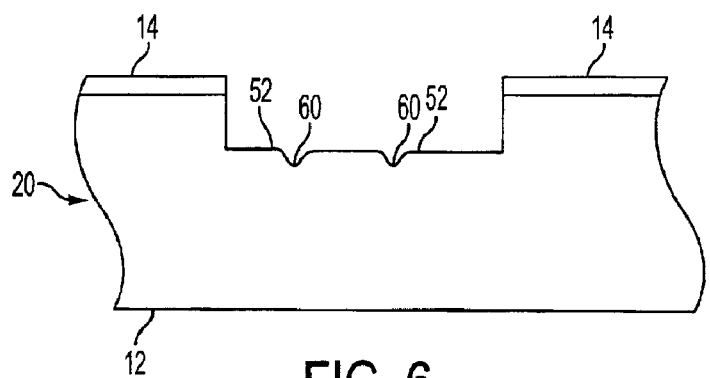
FIG. 6 is side sectional view of FIG. 5 at the end of the process for removing the defect.
Figure 7:
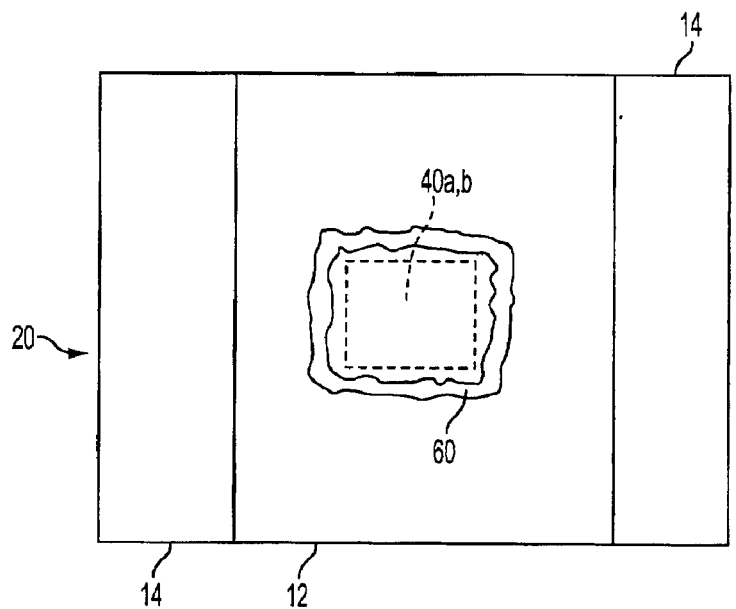
FIG. 7 is a top view of FIG. 6.

FIGS. 6 and 7 illustrate an example of such a secondary defect, sometimes referred to as the riverbed effect. FIG. 6 shows the quartz bump defect 40a, 40b completely removed by the FIB device 50. During such removal, the ion beam from the FIB device 50 scatters upon impact with the top surface of the quartz bump defect 40a, 40b and impacts on the adjacent areas 52 of the transparent substrate 12. An undesirable by-product of such scattering is the secondary defects 60 formed in the substrate 12. FIG. 7 illustrates a top view of the resultant secondary defects 60, or riverbed effect. The quartz bump defect 40a, 40b shown by dashed lines in FIG. 7 has been removed. However, secondary defect shapes are formed on adjacent areas 52 of the substrate 12 as a result of the scattering ion beam from the FIB device 50 hitting the substrate 12.

Figure 8A:
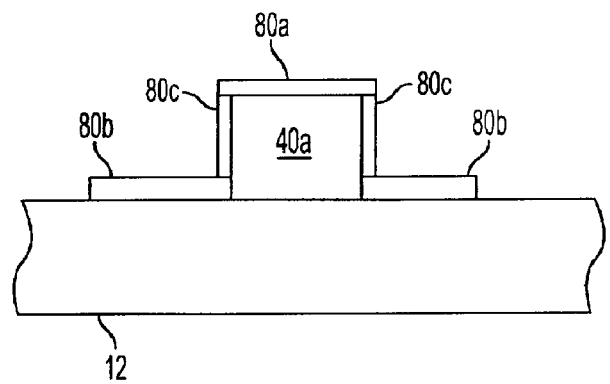
FIGS. 8A–8D are side-sectional views of process steps for removing a defect from a phase shifting mask in accordance with a first embodiment of the present invention.
Figure 8B:
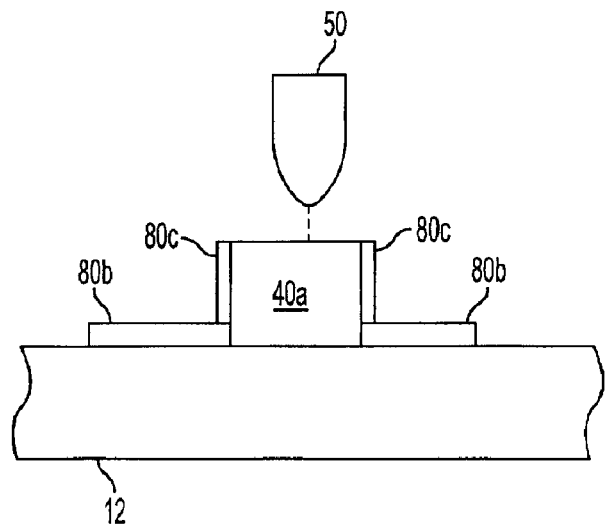
Figure 8C:
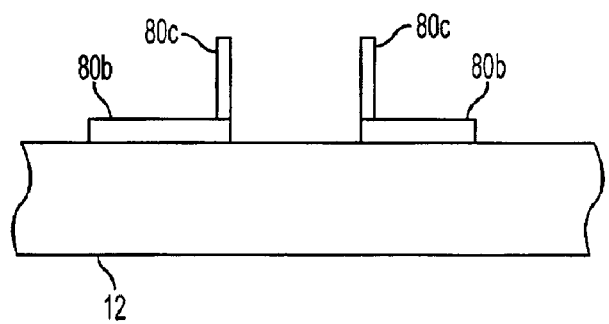

The invention provides a defect removal method which mitigates the aforementioned shortcomings associated with removal of defects 40a, 40b with the use of a FIB device 50. With reference to FIGS. 8A through 8C, the defect 40a is typically located using a mask inspection tool, which may store the location of the defect 40a in a computer file. The computer file containing the location of the bump defect 40a is later used by the FIB device 50 to find and remove the defect 40a.

The bump defect will be referred to as a quartz bump defect, although it will be understood that the defect may be comprised of any suitable transparent material. As is well known when removing defects with a FIB device 50, the dose needed for complete removal of the quartz bump defect 40a is determined. Typically, when removing defects 40a, 40b with a focused ion beam, a small portion of the bump defect 40a, 40b (for example 20–30 nm) is left intact in order to minimize damage to the substrate 12. The remaining portion of the bump defect 40a, 40b is then etched to complete the removal. In the method of the present invention, the dose should exclude additional time needed for removal of the remaining portion of the quartz bump defect 40a, 40b. Typically, five minutes of etching with sodium hydroxide (NaOH) will remove an additional 20–30 nm of material in the repaired region of the quartz substrate 12.

The best edge placement along the edges of the top surface of the quartz bump defect 40a is then determined for directing the focused ion beam onto the quartz bump defect 40a. At this time no concern needs to be devoted to avoiding the riverbed effect or secondary defects to the quartz substrate 12 areas surrounding the quartz bump defect 40a. Concern at this time should be devoted to finding good placement for the focused ion beam remove the quartz bump defect 40a completely.

Next, with reference to FIG. 8A, a thin layer of resist 80 is deposited onto the substrate 12 in the area of the defect 40a. The resist utilized may be commercially available ZEP-7000 resist, or any other suitable resist, and may be deposited in any suitable resist coating apparatus. Portion 80a of the resist covers the upper surface of the defect 40a and portions 80b cover the areas of the substrate 12 adjacent the defect 40a. Portions 80c of the resist cover the sidewalls of the bump defect 40a. The substrate 12 is then heated, or baked, usually at temperatures of 90° to 120°, to degas the resist. At this point, the resist etching rate is typically evaluated and confirmed for the FIB device 50 being used, taking into consideration the etching gas used by that particular device. The thickness of the resist 80 should preferably be in the range of from 10 nm to 200 nm.

The quartz bump defect 40a is then located by the FIB device 50, for example in the secondary electron detector (SED) mode if the SIR-3000X is utilized. The first step in the actual removal process consists of etching the resist portion 80a covering the upper surface of the quartz bump defect 40a. If the SIR-3000X is used, the resist is etched using the alpha gas. During this step, the resist layer 80a is slightly over-etched to expose the quartz of the quartz bump defect 40a. The resist layer 80a may be over-etched by approximately 20 to 30%. Alternatively, the resist may be removed by ion milling, or any other suitable method. The resultant structure is shown in FIG. 8B. Next, the FIB device 50 is used to remove the quartz bump defect 40a using a predefined quartz etch condition. For example, the quartz bump defect can be removed by directing actinic radiation which is generated by the FIB device 50. If the SIR-3000X is used, the quartz bump defect is removed using the beta gas.

During removal of the quartz bump defect 40a, the resist layers 80b and 80c function as a mask, or protective layer for the substrate 12 to reduce the riverbed effect 60, or secondary defects to areas of the substrate 12 adjacent the quartz bump defect 40a. Thereafter, resist layers 80b, 80c are stripped from the substrate 12 using known techniques readily available in the art.

Figure 8D:
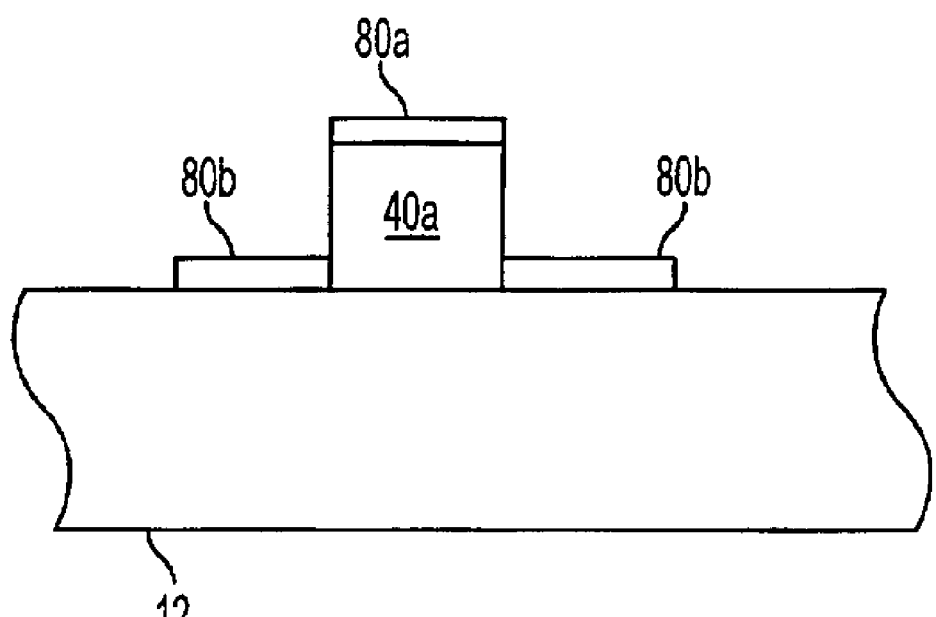

With reference to FIG. 8D, during deposition of resist layer 80 discussed above, resist layers 80a, 80b may be deposited onto the upper surface of the bump defect 40a and onto the adjacent areas of the substrate 12, without resist being deposited onto the sidewalls of the bump defect 40a. This may be due to deposition techniques of the FIB device 50 being used, or may due to masking the substrate 12 such that resist is not deposited on the sidewalls of the bump defect 40a. If a structure of FIG. 8D is formed, the invention is carried out as discussed above in relation to FIGS. 8A through 8C, except that resist layer 80b alone will be utilized to protect the substrate 12 while the bump defect 40a is removed.

Figure 9A:
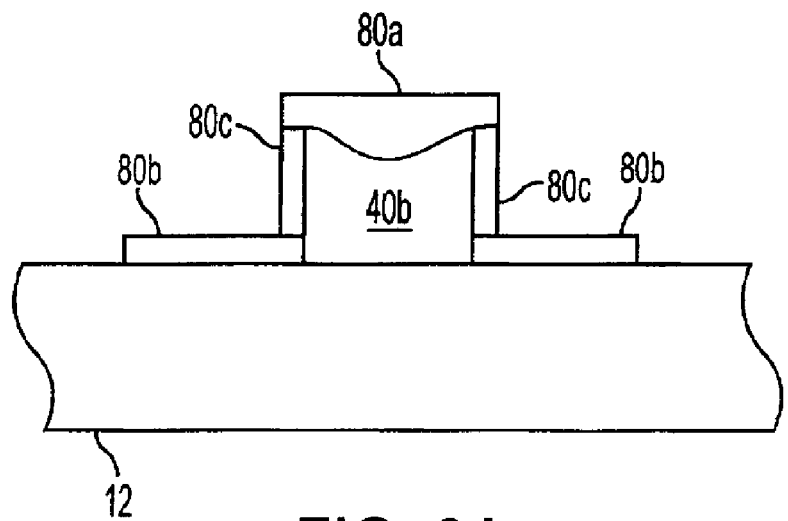
FIGS. 9A and 9B are side-sectional views of process steps for removing a defect from a mask in accordance with a second embodiment of the present invention.
Figure 9B:
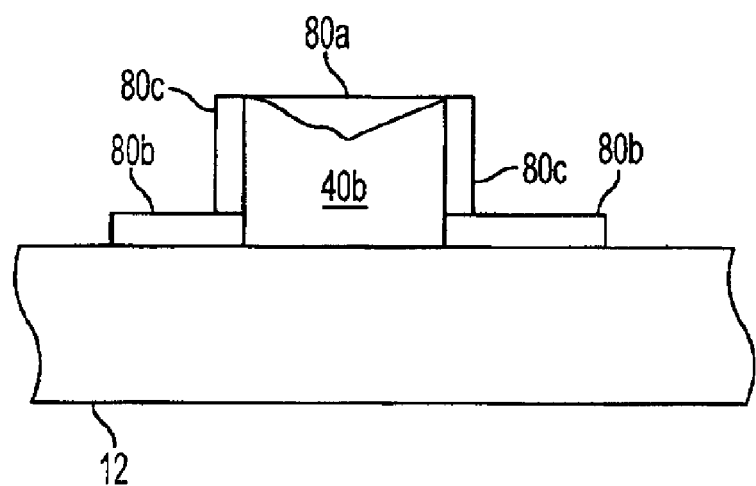

The substantially flat top surface profile of quartz bump defect 40a is considered an ideal situation, because quartz bump defects do not often have flat topography. Quartz bump defects often have a depressed top surface, such as defect 40b illustrated in FIG. 4. The method of the present invention is applicable to removing this type of quartz bump defect as well. With reference to FIGS. 9A and 9B, a layer of resist 80 is deposited onto the quartz substrate 12, wherein resist layer 80a covers the upper surface of the quartz bump defect 40b. The layer or resist 80a fills the recess and any irregularities in the top surface of the quartz bump defect 40b. Resist layer 80b covers the area of the substrate adjacent the quartz bump defect 40b, and resist layer 80c covers the sidewalls of the defect 40b. As discussed above with reference to FIG. 8D, resist layer 80c may or may not be deposited. Thickness of resist layers 80 is preferably 10 nm to 200 nm.

The top portion of resist layer 80a is subsequently removed by etching or a similar process. FIG. 9B shows the quartz bump defect 40b with the resist layer 80a on its top surface removed. A portion of the resist layer 80a remains in the recess portion of quartz bump defect 40b. At this stage, the FIB device 50 is used to remove the quartz bump defect 40b, including the remaining portion of resist layer 80a, using a predefined quartz etch condition, such as by directing actinic radiation generated by the FIB device 50 toward the quartz bump defect 40b. The remaining portion of resist layer 80a helps to minimize the damage to the substrate 12 in the defect center area once the defect is completely removed. During removal of the quartz bump defect 40b, the resist layers 80b and 80c (or 80b alone) functions as a mask, or protective layer for the substrate 12 to reduce the riverbed effect 60, or secondary defects to areas of the substrate 12 adjacent the quartz bump defect 40b.

An alternative method to practice the present invention comprises the following. Rather than depositing a layer of resist 80, a layer of carbon film is deposited onto the top surface of the quartz bump defect 40a, 40b and adjacent areas of the substrate 12. The layer of carbon film 80 can be deposited by the SIR-3000X FIB device, thereby avoiding the need to use a separate resist coating machine. The layer of carbon film is preferably from 10 nm to 200 nm thick. The portion of the carbon film covering the defect is removed by the FIB device 50. Removal can be accomplished by etching, ion milling or any other suitable process. If the SIR-3000X is used then this removal is accomplished using the alpha gas of the device. The quartz bump defect 40a, 40b is then removed, by etching for example, using the beta gas if the FIB device 50 is the SIR-3000X. As with resist areas 80b and 80c (or 80b alone), the carbon film which was deposited in the areas adjacent the quartz bump defect 40a, 40b minimizes the riverbed effect 60, or secondary defects to the quartz substrate 12. After the defect 40a, 40b is removed, remaining carbon film is removed by the alpha gas of the SIR-3000X FIB machine, and the substrate may be cleaned by either an oxygen descum process or any other suitable process.

Figure 10:
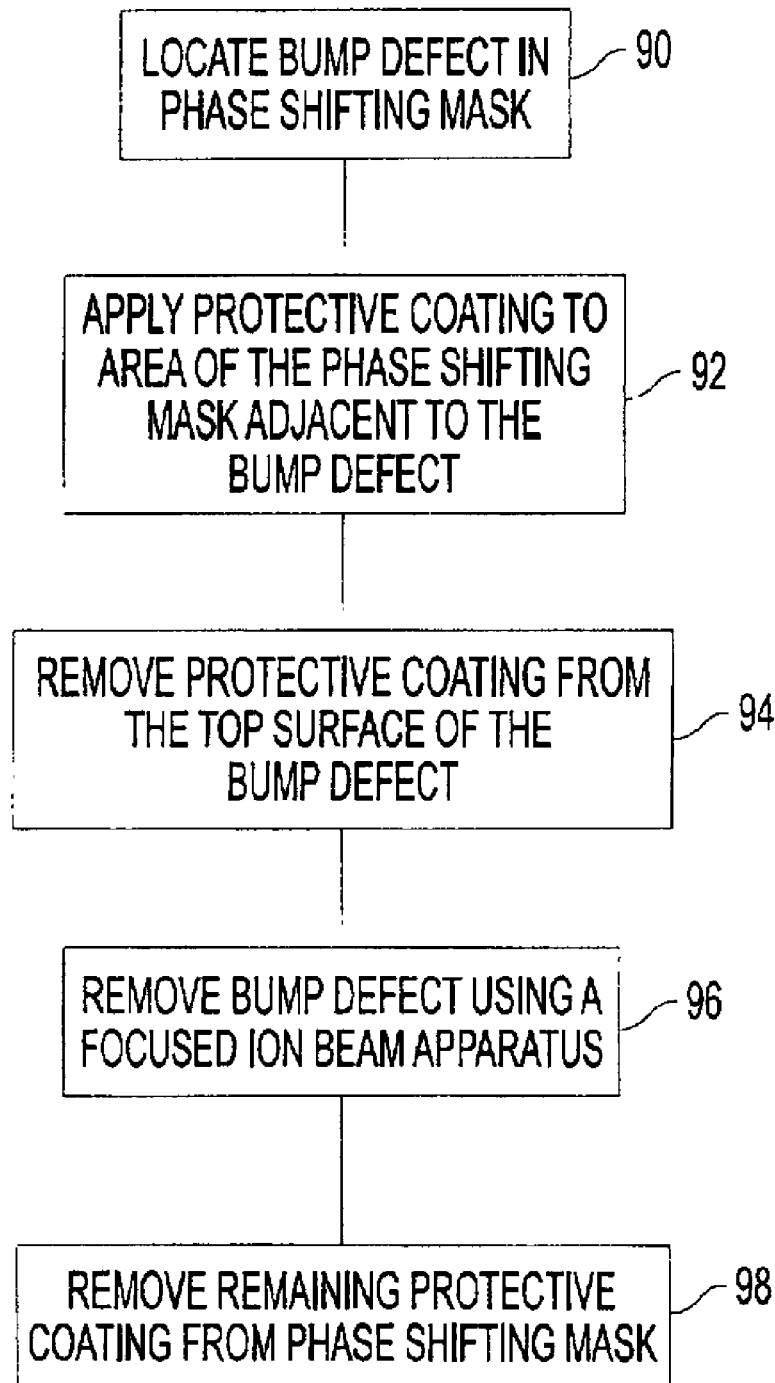
FIG. 10 is a flow-chart of the process steps of the first and second embodiments of the present invention.

FIG. 10 shows the process of the present invention as a series of sequential steps. The basic steps of the process involve locating the bump defect in a phase shifting mask (90) and applying a protective coating to the area of the phase shifting mask adjacent the bump defect (92). The protective coating on the top surface of the bump defect is then removed (94), and the bump defect is removed with the use of a focused ion beam (96) while protective coating remains on adjacent areas of the phase shifting mask to minimize the riverbed effect. The remaining protective coating is thereafter removed (98).

Figure 11A:
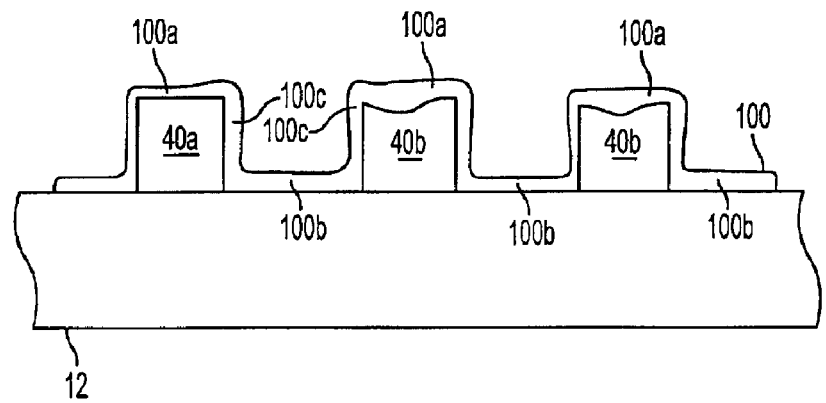
FIGS. 11A and 11B are side-sectional views of process steps for removing a defect from a mask in accordance with a third embodiment of the present invention.

Another method of the present invention will be discussed with reference to FIGS. 11A and 11B. An area of the substrate 12 where bump defects 40a, 40b are known or anticipated to exist is covered with a protective coating 100. The protective coating 100 can be resist or carbon applied as discussed above, or another protective coating. Protective coating layers 100a cover the top portions of the bump defects 40a, 40b, protective coating layers 100b cover the areas of the substrate 12 adjacent the bump defects 40a, 40b, and protective coating layers 100c cover sidewalls of the bump defects 40a, 40b. As discussed above with reference to FIG. 8D, protective coating layers 100c may or may not be deposited. Thereafter, a mask inspection device is utilized to locate the raised bump defects 40a, 40b which have been covered by the protective coating 100. The locations of the bump defects are stored in a computer file to be used by the FIB device 50 in subsequent steps.

Figure 11B:
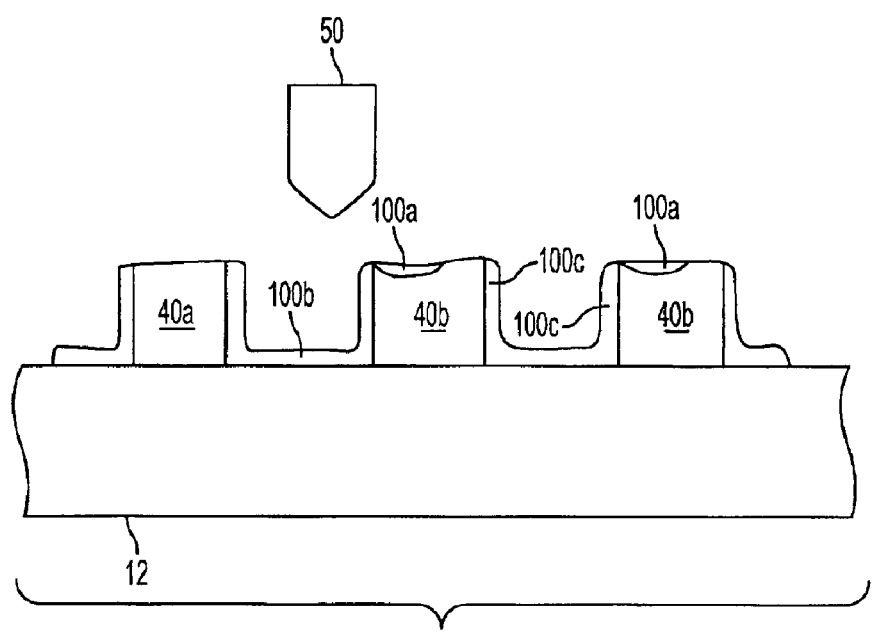
Figure 12:
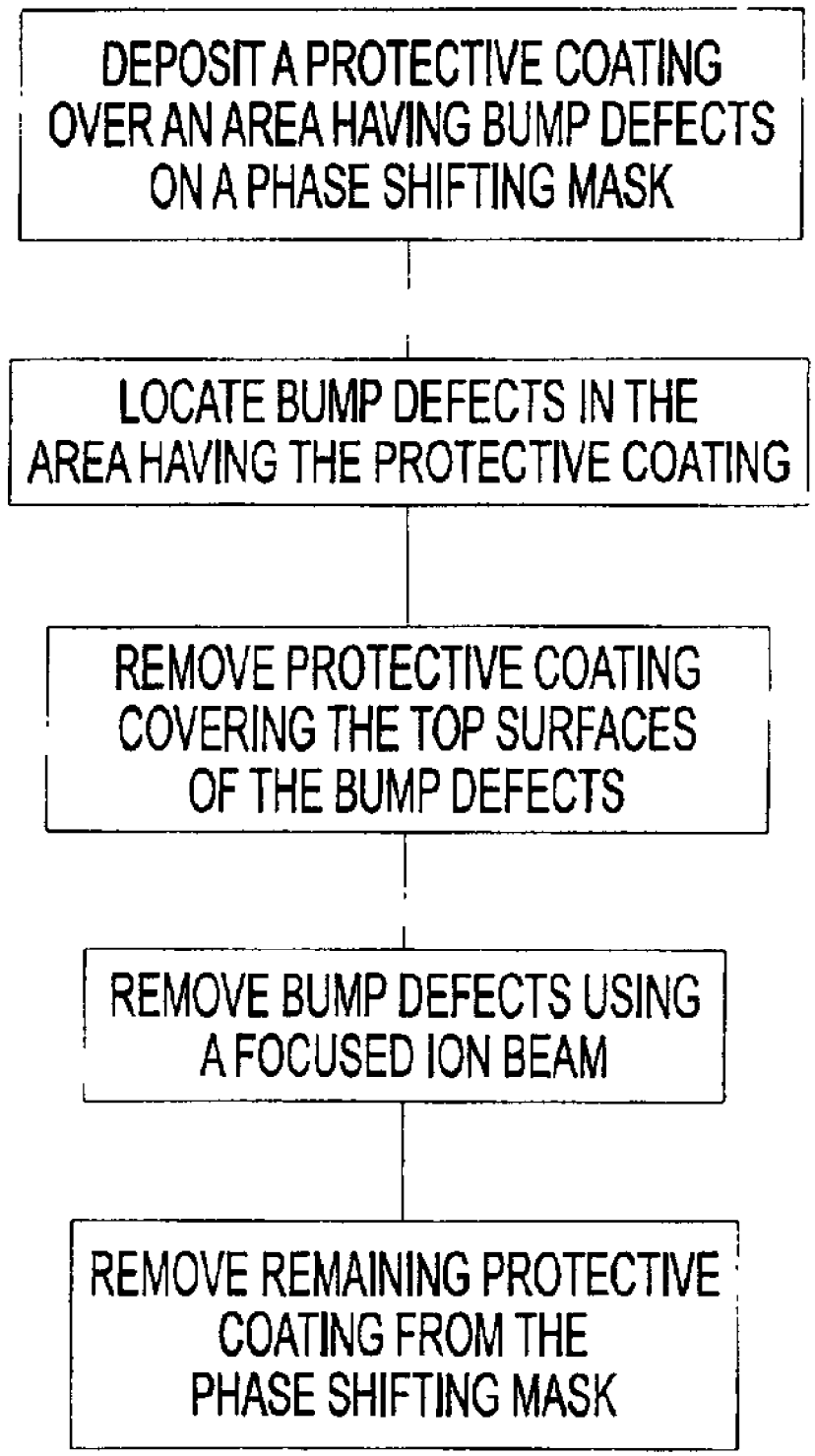
FIG. 12 is a flow-chart of the process steps of the third embodiment of the present invention.

Referring to FIG. 11B, the protective coating layers 100a are removed as discussed above by etching, or another suitable process, to expose the upper surfaces of the bump defects 40a. 40b. Note that bump defects 40b having uneven upper surfaces may have a portion of layer 100a remaining in the recesses of the upper surfaces. The exposed bump defects 40a, 40b are then removed by the focused ion beam of the FIB device 50 as described above. Remaining protective coating portions 100b and 100c (or only 100b) are removed by etching or another suitable process, and the substrate 12 may be cleaned by an oxygen descum process. The steps comprising the method just recited are shown in FIG. 12.

The methods of the present invention can be practiced with parallel efficacy without applying a blanket protective coating layer over a substrate area containing a bump defect. The bump defect(s) may be located using a mask inspection device, and the areas representing the top surface(s) of the bump defect(s) may be isolated using photolithographic techniques available in the art. Thereafter the protective coating layer could be deposited only onto the areas of the substrate adjacent the bump defect(s), and the bump defect(s) would then be removed using a focused ion beam. This method would eliminate the step of having to first remove the protective coating layer(s) covering the top surface(s) of the bump defect(s) prior to removing the bump defect(s). Additionally, the next generation of FIB devices 50 may be able to locate the bump defects without the use of an external mask inspection device.

Figure 13:
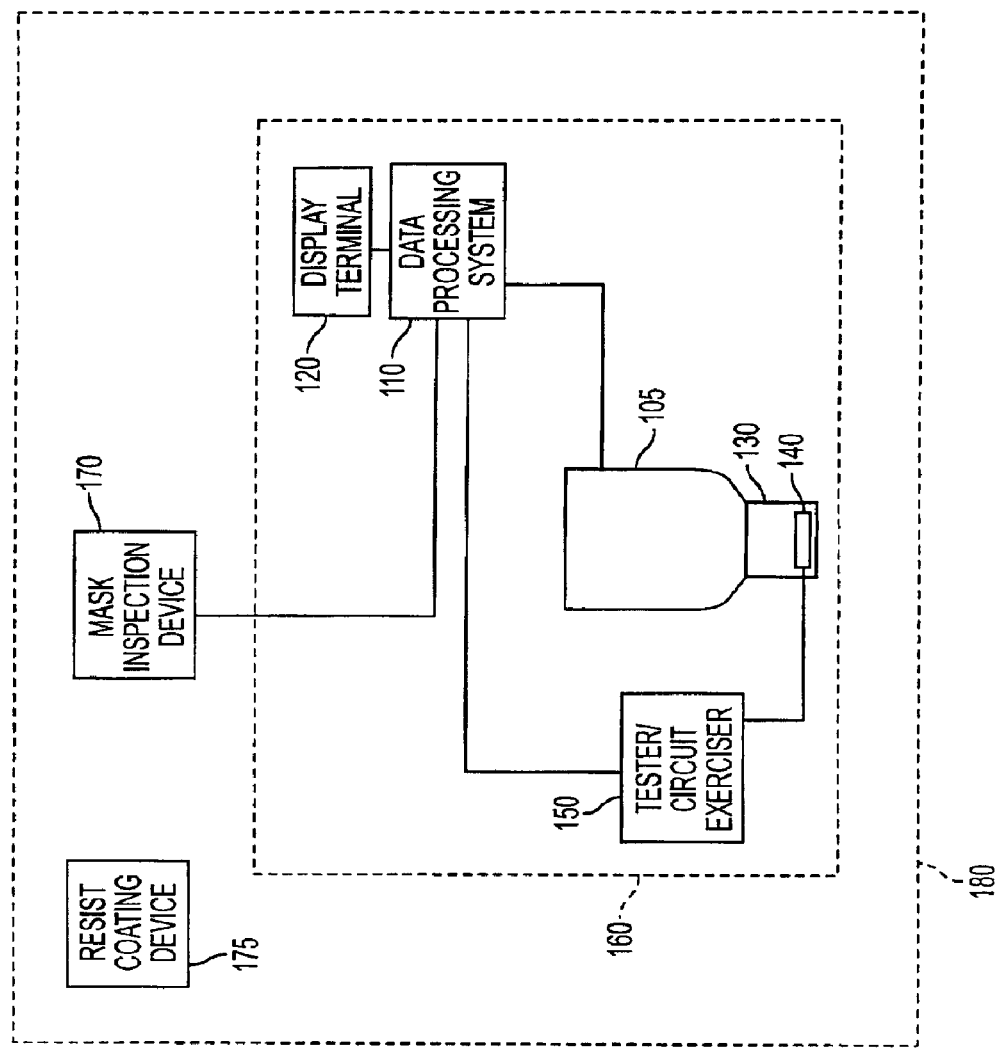
FIG. 13 is a schematic view of a focused ion beam device which may be used to carry out the process of the present invention.

A typical FIB device usable for the aforementioned processes is schematically illustrated in FIG. 13. The FIB device 160 has as its main functional elements a focused ion beam probe 105, a tester/circuit exerciser 150, and a data processing system 110. The data processing system may further include a display terminal 120. The focused ion beam probe 105 has a vacuum chamber 130 into which a device 140 is placed for processing. The device 140 can be a phase shifting mask or any other integrated circuit device. The focused ion beam probe 105 can, in response to commands supplied from the data processing system 110, be aimed at a desired location on the device 140. The FIB device 160 can be aimed at a desired location on the device 140 in response to commands supplied from the data processing system 110. The tester/circuit exerciser 150 can supply test signals to the device 140 from the data processing system 110 to test various parameters of the device 140. The foregoing is rudimentary discussion of a typical FIB device 160, the finer details of which are well know in the art. A mask inspection device 170 can be used to locate bump defects on a mask and relate the locations to the data processing system 110 of the FIB device 160. The mask inspection device 170 and the FIB device 160 comprise the apparatus 180 for carrying out the present invention. If resist is used as the protective coating, resist coating device 175 is also included in the apparatus 180.

While exemplary embodiments of the invention have been described and illustrated, it should be apparent that many modifications can be made to the present invention without departing from its spirit and scope. For example, while protective coatings have been described as being layers of resist or carbon film, other suitable protective material layers can also be used. Also, although removal of free-standing bump-type defects has been described, the method of the present invention is applicable for removing defects attached to other structures, and defects of various shapes and sizes. Accordingly the invention is not limited by the foregoing description or drawings, but is only limited by the scope of the appended claims.

What is claimed as new and desired to be protected by Letters Patent of the United States is:

1. A method for repairing a defect in a mask for an integrated circuit comprising:

locating at least one bump defect in a mask;

depositing a first portion of a protective coating layer onto an upper surface of said bump defect and a second portion of said protective coating layer onto areas of said mask adjacent said bump defect;

removing said first portion of said protective coating layer; and removing said bump defect with said second portion of said protective coating layer protecting said adjacent areas.

2. The method according to claim 1 further comprising removing said second portion of said protective coating layer.

3. The method according to claim 1 wherein said step of removing said bump is accomplished with a focused ion beam.

4. The method according to claim 1 wherein said first and second portions of said protective coating layer comprise a resist.

5. The method according to claim 4 wherein said resist is deposited to a thickness of from 10 nm to 200 nm.

6. The method according to claim 1 wherein said first and second portions of said protective coating layer comprise carbon.

7. The method according to claim 6 wherein said carbon is deposited to a thickness of from 10 nm to 200 nm.

8. The method according to claim 1 wherein said step of removing said first portion of said protective coating layer comprises etching.

9. The method according to claim 1 wherein said step of removing said first portion of said protective coating layer comprises ion milling.

10. The method according to claim 8 wherein said step of etching said first portion of said protective coating layer comprises over etching into said bump defect.

11. The method according to claim 1 wherein said step of depositing said first portion of said protective coating layer comprises depositing said protective coating layer into recesses in said upper surface of said bump defect.

12. The method according to claim 1 wherein said mask is a phase shifting mask.

13. The method according to claim 1 further comprising depositing a third portion of said protective coating layer onto sidewalls of said bump defect and preserving said third portion while said bump defect is removed.

14. The method according to claim 13 further comprising removing said third portion of said protective coating layer after said bump defect is removed.

15. A method for minimizing damage to a mask when removing defects comprising:

locating a bump defect created during formation of said mask;

depositing a layer of protective material onto a top surface of said bump defect and onto an area of said mask adjacent said bump defect;

removing said layer of protective material from said top surface of said bump defect while preserving said layer of protective material on said areas of said mask adjacent said bump defect;

removing said bump defect from said mask; and removing said layer of protective material from said mask.

16. The method according to claim 15 wherein said step of removing said bump defect is accomplished with a focused ion beam.

17. The method according to claim 15 wherein said protective coating comprises a resist.

18. The method according to claim 17 wherein said resist is deposited to a thickness of from 10 nm to 200 nm.

19. The method according to claim 15 wherein said protective coating comprises carbon.

20. The method according to claim 19 wherein said carbon is deposited to a thickness of from 10 nm to 200 nm.

21. The method according to claim 15 wherein said step of removing said layer of protective material from said top surface of said bump defect comprises etching.

22. The method according to claim 15 wherein said step of removing said layer of protective material from said top surface of said bump defect comprises ion milling.

23. The method according to claim 21 wherein said step of etching said layer of protective material from said top surface of said bump defect comprises over etching into said bump defect.

24. The method according to claim 15 wherein said step of depositing said layer of protective material onto said top surface of said bump defect comprises depositing said protective material into recesses in said bump defect.

25. The method according to claim 15 wherein said mask is a phase shifting mask.

26. The method according to claim 15 further comprising depositing a layer of said protective material onto sidewalls of said bump defect.

27. The method according to claim 26 further comprising preserving said layer of said protective material on said sidewalls of said bump defect while said bump defect is removed.

28. A method for removing a quartz bump defect from a quartz phase shifting mask comprising:

locating a quartz bump defect on a substrate of said phase shifting mask;

depositing a first portion of protective material over a top surface of said quartz bump defect;

depositing a second portion of protective material over areas of said substrate adjacent said quartz bump defect;

depositing a third portion of protective material onto sidewalls of said quartz bump defect;

removing said first portion of protective material with an etching gas;

removing said quartz bump defect from said substrate with a focused ion beam tool while said second layer of protective material minimizes damage to areas of said substrate adjacent said quartz bump defect; and removing said second and third layers of said protective material from said substrate.

29. The method according to claim 28 wherein said step of removing said quartz bump defect is accomplished with a focused ion beam.

30. The method according to claim 28 wherein said first, second and third portions of protective material comprise a resist.

31. The method according to claim 30 wherein said resist is deposited to a thickness of from 10 nm to 200 nm.

32. The method according to claim 28 wherein said first, second and third portions of protective material comprise carbon coating.

33. The method according to claim 32 wherein said carbon coating is deposited to a thickness of from 10 nm to 200 nm.

34. The method according to claim 28 wherein said step of removing said first portion of protective material comprises over etching into said quartz bump defect.

35. The method according to claim 28 wherein said step of depositing said first portion of protective material comprises depositing said protective material into recesses in said quartz bump defect.

36. A method for minimizing damage to a substrate of a mask comprising:

locating an area in a substrate containing at least one bump defect;

depositing a protective layer onto said area and over said at least one bump defect;

locating said at least one bump defect in said area;

removing a portion of said protective layer covering an upper surface of said at least one located bump defect;

removing said at least one located bump defect.

37. The method according to claim 36 wherein said mask is a phase shifting mask.

38. The method according to claim 36 further comprising removing remaining portions of said protective layer.

39. The method according to claim 36 wherein said step of removing said at least one located bump defect is accomplished with a focused ion beam.

40. The method according to claim 36 wherein said protective layer comprises a resist.

41. The method according to claim 40 wherein said resist is deposited to a thickness of from 10 nm to 200 nm.

42. The method according to claim 36 wherein said protective layer comprises carbon.

43. The method according to claim 42 wherein said carbon is deposited to a thickness of from 10 nm to 200 nm.

44. The method according to claim 36 wherein said step of removing said portion of said protective layer covering said upper surface of said at least one located bump defect comprises etching.

45. The method according to claim 36 wherein said step of removing said portion of said protective layer covering said upper surface of said at least one located bump defect comprises ion milling.

46. The method according to claim 44 wherein said step of etching comprises over etching into said at least one located bump defect.

47. The method according to claim 36 wherein said step of depositing said protective layer comprises depositing said protective layer into recesses in said upper surface of said at least one located bump defect.

48. A method for minimizing damage to a mask when removing defects comprising:

locating at least one bump defect created during formation of said mask;

depositing a layer of protective material onto an area of said mask adjacent said at least one located bump defect;

removing said at least one located bump defect from said mask; and removing said layer of protective material from said mask.

49. The method according to claim 48 wherein said mask is a phase shifting mask.

50. The method according to claim 48 wherein said step of removing said at least one located bump defect is accomplished with a focused ion beam.

51. The method according to claim 48 wherein said layer of protective material comprises a resist.

52. The method according to claim 51 wherein said resist is deposited to a thickness of from 10 nm to 200 nm.

53. The method according to claim 48 wherein said layer of protective material comprises carbon.

54. The method according to claim 53 wherein said carbon is deposited to a thickness of from 10 nm to 200 nm.

* * * * *